United States Patent
Ke

(10) Patent No.: US 12,185,597 B2
(45) Date of Patent: Dec. 31, 2024

(54) ARRAY SUBSTRATE AND MANUFACTURING METHOD THEREOF

(71) Applicants: WUHAN CHINA STAR OPTOELECTRONICS TECHNOLOGY CO., LTD., Wuhan (CN); WUHAN CHINA STAR OPTOELECTRONICS SEMICONDUCTOR DISPLAY TECHNOLOGY CO., LTD., Wuhan (CN)

(72) Inventor: Linbo Ke, Wuhan (CN)

(73) Assignees: WUHAN CHINA STAR OPTOELECTRONICS TECHNOLOGY CO., LTD., Wuhan (CN); WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 0 days.

(21) Appl. No.: 17/434,992

(22) PCT Filed: Jun. 3, 2021

(86) PCT No.: PCT/CN2021/098049
§ 371 (c)(1),
(2) Date: Aug. 30, 2021

(87) PCT Pub. No.: WO2022/246886
PCT Pub. Date: Dec. 1, 2022

(65) Prior Publication Data
US 2024/0032349 A1    Jan. 25, 2024

(30) Foreign Application Priority Data
May 24, 2021 (CN) .......................... 202110563513.3

(51) Int. Cl.
*H10K 59/126* (2023.01)
*H01L 29/66* (2006.01)
(Continued)

(52) U.S. Cl.
CPC ...... *H10K 59/126* (2023.02); *H01L 29/66742* (2013.01); *H01L 29/78633* (2013.01); *H10K 59/1201* (2023.02)

(58) Field of Classification Search
CPC .............. H10K 59/126; H10K 59/1201; H01L 29/667742; H01L 29/78633
(Continued)

(56) References Cited

U.S. PATENT DOCUMENTS

2016/0093647 A1* 3/2016 Kim .................... H01L 27/1255
257/40
2018/0040632 A1* 2/2018 Zhang ............... G02F 1/136209
(Continued)

FOREIGN PATENT DOCUMENTS

CN    107068770 A    8/2017
CN    109326609 A    2/2019
(Continued)

OTHER PUBLICATIONS

Machine English Translation of CN 112768497 (Year: 2021).*
(Continued)

*Primary Examiner* — Dzung Tran
(74) *Attorney, Agent, or Firm* — PV IP PC; Wei Te Chung

(57) ABSTRACT

The present invention provides an array substrate and a manufacturing method thereof, the array substrate forms a dual U-shaped conductor structure encompassing a first thin film transistor and a second thin film transistor by a first light shielding layer, a second light shielding layer, a first shielding layer, and a second shielding layer to perfectly shield
(Continued)

moving charges in the film layer under the thin film transistor and the film layers on two sides of the thin film transistor outside the dual U-shaped conductor structure to keep excellent electrical properties of a device.

4 Claims, 6 Drawing Sheets

(51) Int. Cl.
*H01L 29/786* (2006.01)
*H10K 59/12* (2023.01)
(58) Field of Classification Search
USPC .................................................. 257/40
See application file for complete search history.

(56) References Cited

U.S. PATENT DOCUMENTS

| | | | |
|---|---|---|---|
| 2018/0145123 A1* | 5/2018 | Kim | .............. H01L 27/124 |
| 2019/0355763 A1 | 11/2019 | Chen et al. | |
| 2020/0144297 A1 | 5/2020 | Ban et al. | |
| 2020/0411619 A1 | 12/2020 | Huang et al. | |

FOREIGN PATENT DOCUMENTS

| | | | |
|---|---|---|---|
| CN | 110875363 | A | 3/2020 |
| CN | 110911445 | A | 3/2020 |
| CN | 111192884 | A | 5/2020 |
| CN | 111326669 | A | 6/2020 |
| CN | 111599825 | A | 8/2020 |
| CN | 111725324 | A | 9/2020 |
| CN | 111739922 | A | 10/2020 |
| CN | 111863837 | A | 10/2020 |
| CN | 112768497 | A | 5/2021 |
| KR | 20150075512 | A | 7/2015 |

OTHER PUBLICATIONS

Machine English Translation of CN 110875363 (Year: 2020).*
Chinese Office Action issued in corresponding Chinese Patent Application No. 202110563513.3 dated May 27, 2022, pp. 1-9.
International Search Report in International application No. PCT/CN2021/098049, mailed on Feb. 22, 2022.
Written Opinion of the International Searching Authority in International application No. PCT/CN2021/098049, mailed on Feb. 22, 2022.

* cited by examiner

ARRAY SUBSTRATE AND MANUFACTURING METHOD THEREOF

RELATED APPLICATIONS

This application is a Notional Phase of PCT Patent Application No. PCT/CN2021/098049 having international filing date of Jun. 3, 2021, which claims the benefit of priority of Chinese Patent Application No. 202110563513.3 filed on May 24, 2021. The contents of the above applications are all incorporated by reference as if fully set forth herein in their entirety.

FIELD OF INVENTION

The present invention relates to a field of display technologies, especially to an array substrate and a manufacturing method thereof.

BACKGROUND OF INVENTION

In a conventional organic light emitting diode (OLED) display device, to achieve low power consumption, a mainstream technology is using low temperature polysilicon (LTPS) as an active layer in a thin film transistor (TFT) and a switch thin film transistor. However, LTPS has a greater carrier mobility and therefore has a issue of higher leakage current. On this basis, low temperature polycrystalline oxide (LTPO) technology has been developed. LTPO combines advantages of both LTPS and metal oxide to form a solution of fast response and low power consumption.

However, an organic film layer and an inorganic film layer below a TFT device in the current mainstream flexible display screen have certain moving charges, etc. The moving charges are driven by the current of the TFT device, etc., which adversely affects the normal work of the device such that electrical performance of the TFT device is deteriorated, and optical evaluation items such as the restoration of residual images would be affected adversely.

SUMMARY OF INVENTION

Technical Issue

An objective of the present invention is to provide an array substrate and a manufacturing method thereof to solve a technical issue that moving charges of conventional organic film layer and inorganic film layer influence normal work of a thin film transistor device to deteriorate electrical performance of the device.

Technical Solution

To achieve the above objective, the present invention provides an array substrate, the array substrate comprises first thin film transistor, a second thin film transistor, a first light shielding layer, a second light shielding layer, a first shielding layer, and a second shielding layer.

The first thin film transistor and the second thin film transistor are disposed on a base layer. The first light shielding layer is disposed under the first thin film transistor and disposed opposite to a first active layer in the first thin film transistor. The second light shielding layer is disposed under the second thin film transistor and disposed opposite to a second active layer of the second thin film transistor. A bottom surface of the second light shielding layer is connected to the first light shielding layer. The first shielding layer is disposed on a side of the first thin film transistor away from the second thin film transistor. An end of the first shielding layer is electrically connected to a first source and drain electrode of the first thin film transistor, and another end of the first shielding layer is electrically connected to the first light shielding layer. The second shielding layer is disposed on a side of the second thin film transistor away from the first thin film transistor. An end of the second shielding layer is electrically connected to a second source and drain electrode of the second thin film transistor, and another end of the second shielding layer is electrically connected to the second light shielding layer.

Furthermore, the first active layer and the second active layer are located between the first shielding layer and the second shielding layer.

Furthermore, the array substrate further comprises a buffer layer disposed between the base layer and the first thin film transistor, or disposed between the base layer and the second thin film transistor.

Furthermore, the first thin film transistor comprises a first active layer, a first insulation layer, a first gate electrode, a first dielectric layer, and a first source and drain electrode.

The first insulation layer is disposed on the buffer layer. The first active layer is disposed between the first insulation layer and the buffer layer, or disposed in the first insulation layer. The first gate electrode is disposed on a surface of the first insulation layer away from the buffer layer and disposed opposite to the first active layer. The first dielectric layer is disposed on the first insulation layer and covering the first gate electrode. The first source and drain electrode is disposed on a surface of the first dielectric layer away from the first gate electrode.

The first source and drain electrode comprises a first drain electrode and a first source electrode. A bottom surface of first drain electrode comprises a first protrusion portion, the first protrusion portion extends through the first dielectric layer and the first insulation layer and is electrically connected to the first active layer. A bottom surface of first source electrode comprises a second protrusion portion, the second protrusion portion extends through the first dielectric layer and the first insulation layer and is electrically connected to the first active layer.

Furthermore, when the first active layer is disposed in the first insulation layer, the buffer layer comprises a first recess, and a recess opening of the first recess faces the first active layer. The first light shielding layer is disposed on a bottom surface of the first recess. The first insulation layer is disposed on the buffer layer and is filled in the first recess Furthermore, the second thin film transistor comprises a second active layer, a second insulation layer, a second gate electrode, a second dielectric layer, and a second source and drain electrode.

The second dielectric layer disposed between the first dielectric layer and the first source and drain electrode. The second active layer disposed between the first dielectric layer and the second dielectric layer, or disposed in the second dielectric layer. The second insulation layer disposed on a surface of the second active layer away from the first dielectric layer. The second gate electrode disposed on a surface of the second insulation layer away from the second active layer. The second source and drain electrode disposed on a surface of the second dielectric layer away from the second gate electrode.

The second source and drain electrode comprises a second drain electrode and a second source electrode. A bottom surface of second drain electrode comprises a third protrusion portion, the third protrusion portion extends through the second dielectric layer and is electrically connected to the second active layer. An end of the second drain electrode near the first thin film transistor is electrically connected to the first source electrode. The second source electrode, wherein a bottom surface of second source electrode comprises a fourth protrusion portion, the fourth protrusion portion extends through the second dielectric layer and is electrically connected to the second active layer.

Furthermore, when the second active layer is disposed in the second dielectric layer, the first dielectric layer comprises a second recess, and a recess opening of the second recess faces the second active layer. The second light shielding layer is disposed on a bottom surface of the second recess. The second dielectric layer is disposed on the first dielectric layer and is filled in the second recess.

Furthermore, the array substrate further comprises a third shielding layer located between the second protrusion portion and the third protrusion portion. An end of the third shielding layer is electrically connected to the second light shielding layer, and another end of the third shielding layer extends through the second dielectric layer and is electrically connected to the first source electrode and the second drain electrode.

The present invention also provides an array substrate manufacturing method, the manufacturing method comprises steps as follows:

Manufacturing a buffer layer on the base layer. Manufacturing a first light shielding layer on the base layer. Manufacturing a second light shielding layer on the buffer layer. Manufacturing a first thin film transistor on the first light shielding layer. Manufacturing a second thin film transistor on the second light shielding layer.

When the first thin film transistor is manufactured, manufacturing a first shielding layer on a side of the first thin film transistor away from the second thin film transistor. When the second thin film transistor is manufactured, manufacturing a second shielding layer on a side of the second thin film transistor away from the first thin film transistor.

Furthermore, the array substrate manufacturing method further comprises steps as follows:

Etching the buffer layer to form a first recess, and manufacturing the first light shielding layer in the first recess. Etching a first dielectric layer of the first thin film transistor to form a second recess, and manufacturing the second light shielding layer in the second recess. Manufacturing a third shielding layer between the first thin film transistor and the second thin film transistor Advantages Advantages of the present invention are as follows: An array substrate and a manufacturing method thereof provided by the present invention form a first shielding layer and a second shielding layer connected to a source and drain electrode and a light shielding layer on two sides of a thin film transistor respectively. The first shielding layer and a first light shielding layer forms a structure similar to a U-shaped structure, and the second shielding layer and the second light shielding layer form a structure similar to a U-shaped structure. Therefore, the two light shielding layers and the two shielding layers form a dual U-shaped conductor structure encompassing the first thin film transistor and the second thin film transistor to perfectly shield moving charges in a film layer under the thin film transistor and film layers on two sides of the thin film transistor outside the dual U-shaped conductor structure, which simultaneously keeps excellent electrical properties of the device and mitigates and fixes an issue of afterimages to increase stability of the display panel.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

Figure 1:
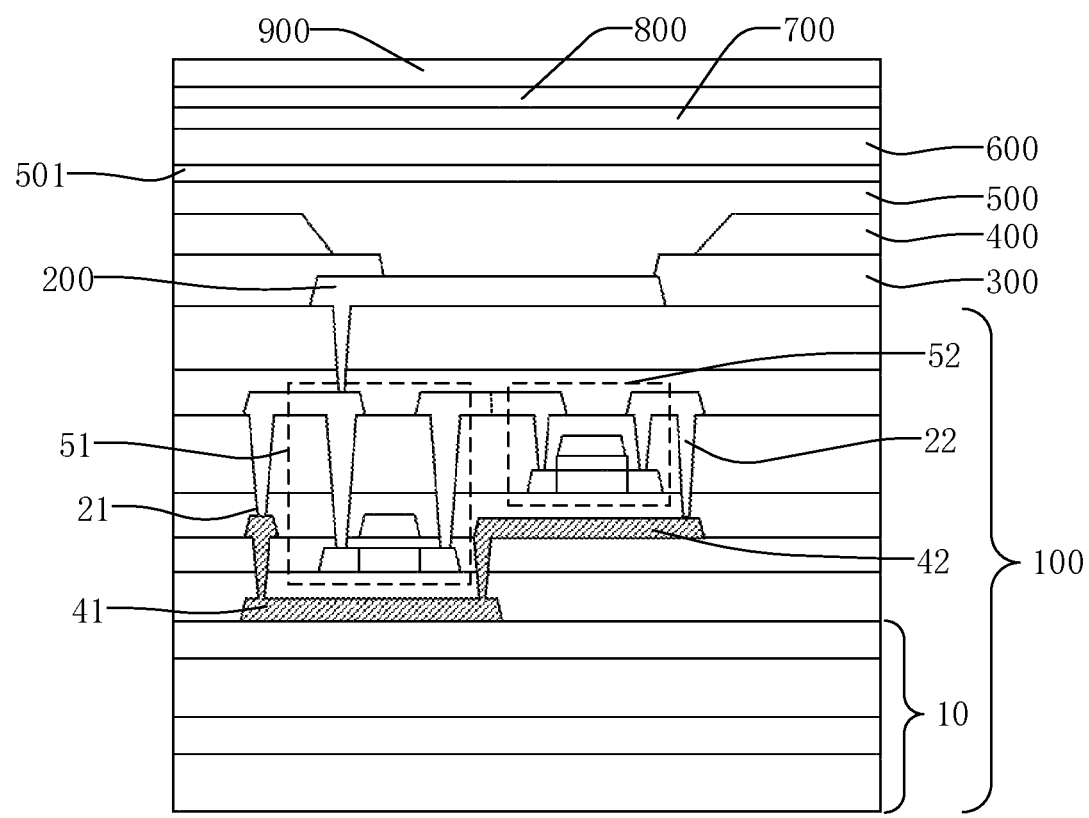
FIG. 1 is a schematic structural layer view of a display panel of a first embodiment of the present invention.

Reference characters in the figures are as follows:

| | |
|---|---|
| array substrate 100; | pixel electrode 200; |
| pixel definition layer 300; | support column 400; |
| organic light emitting layer 500; | cathode 501; |
| thin film encapsulation layer 600; | touch layer 700; |
| polarizer 800; | cover plate 900; |
| base layer 10; | first flexible layer 11; |
| first barrier layer 12; | second flexible layer 13; |
| second barrier layer 14; | first shielding layer 21; |
| first connection portion 211; | second connection portion 212; |
| second shielding layer 22; | third shielding layer 23; |
| buffer layer 30; | first recess 31; |
| first light shielding layer 41; | second light shielding layer 42; |
| third connection portion 421; | first thin film transistor 51; |
| first active layer 511; | first insulation layer 512; |
| first gate electrode 513; | first dielectric layer 514; |
| second recess 5141; | first source and drain electrode 515; |
| first drain electrode 515A; | first protrusion portion 591; |
| first source electrode 515B; | second protrusion portion 592; |
| second thin film transistor 52; | second active layer 521; |
| second insulation layer 522; | second gate electrode 523; |
| second dielectric layer 524; | second source and drain electrode 525; |
| second drain electrode 525A; | third protrusion portion 593; |
| second source electrode 525B; | fourth protrusion portion 594; |
| passivation layer 60; | planarization layer 70. |

DETAILED DESCRIPTION OF PREFERRED EMBODIMENTS

The preferred embodiments of the present invention are described below with reference to the accompanying drawings, which are used to exemplify the embodiments of the present invention to a person of ordinary skill in the art to make the technical contents of the present invention clearer and easy to understand. However, the present invention may be embodied in many different forms of embodiments, and the scope of the invention is not limited to the embodiments mentioned herein.

First Embodiment

The embodiment of the present invention provides a display panel. With reference to FIG. 1, the display panel comprises an array substrate 100, a pixel electrode 200, a pixel definition layer 300, a support column 400, an organic light emitting layer 500, a thin film encapsulation layer 600, a touch layer 700, a polarizer 800, and a cover plate 900.

The array substrate 100 uses a low temperature polycrystalline oxide (LTPO) type array substrate 100 integrated advantages of low temperature polysilicon and oxide and has merits of fast response speed and lower power consumption. With reference to FIG. 1, the array substrate 100 comprises a base layer 10, a first light shielding layer 41, a second light shielding layer 42, a first shielding layer 21, a second shielding layer 22, a buffer layer 30, and a first thin film transistor 51 and a second thin film transistor 52 disposed on the base layer 10.

Figure 2:
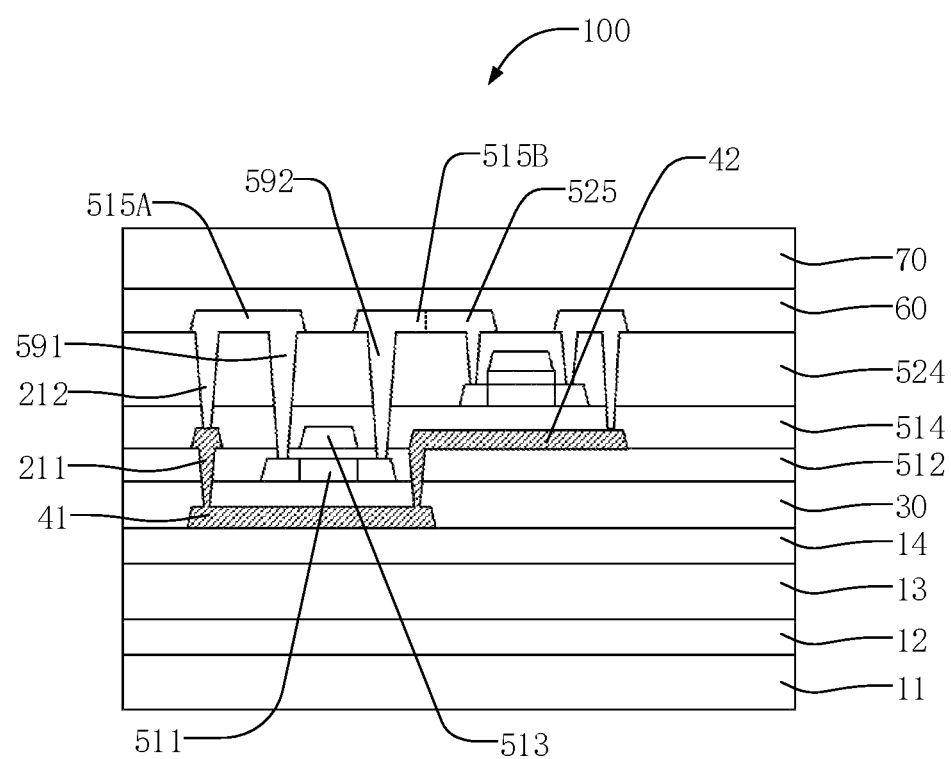
FIG. 2 is a schematic structural layer view of an array substrate of the first embodiment of the present invention.

With reference to FIG. 2, the base layer 10 comprises a first flexible layer 11, a second flexible layer 13, a first barrier layer 12, and a second barrier layer 14. The first flexible layer 11 and the first barrier layer 12 are stacked together, the second flexible layer 13 is disposed on a surface of the first barrier layer 12 away from the first flexible layer 11, and the second barrier layer 14 is disposed on a surface of the second flexible layer 13 away from the first barrier layer 12. Material of the first flexible layer 11 and the second flexible layer 13 is polyimide. Because of characteristic of the polyimide material, the array substrate 100 is bendable to achieve a curve display and a bending display. Material of the first barrier layer 12 and the second barrier layer 14 is organic material or inorganic material, and is configured to block water oxygen and prevent a device in the array substrate 100 from corrosive degeneration, guarantee stability of the device, and prolong a lifespan of the array substrate 100.

The first light shielding layer 41 is disposed o a surface n of the second barrier layer 14 away from the second buffer layer 30 and corresponds to a first active layer 511 of the first thin film transistor 51. The first light shielding layer 41 is metal material and has a function configured to shield the first thin film transistor 51 to prevent light from influencing operation of the first active layer 511.

The buffer layer 30 is disposed on the second barrier layer 14 and covers the first light shielding layer 41. The buffer layer 30 is an inorganic insulative material and is configured to insulatively protect the first light shielding layer 41 and simultaneously buffer and protect the first thin film transistor 51 and the second thin film transistor 52.

With reference to FIG. 2, the first thin film transistor 51 is disposed on the buffer layer 30 and comprises a first active layer 511, a first insulation layer 512, a first gate electrode 513, a first dielectric layer 514, and a first source and drain electrode 515.

The first active layer 511 is disposed on a surface of the buffer layer 30 away from the first light shielding layer 41 and is manufactured by a low temperature polysilicon material. The first insulation layer 512 is disposed on the buffer layer 30, and covers the first active layer 511. The first gate electrode 513 is disposed on a surface of the first insulation layer 512 away from the first active layer 511 and corresponds to a channel region of the first active layer 511. The first dielectric layer 514 is disposed on the first insulation layer 512 and covers the first gate electrode 513. The first source and drain electrode 515 is disposed on the first dielectric layer 514.

The second light shielding layer 42 and the first gate electrode 513 are disposed in the same layer, are located between the first dielectric layer 514 and the first insulation layer 512, and correspond to a second active layer 521 of the second thin film transistor 52. The second light shielding layer 42 also uses metal material and is configured to shield the second thin film transistor 52 to prevent light from influencing operation of the second active layer 521.

Figure 3:
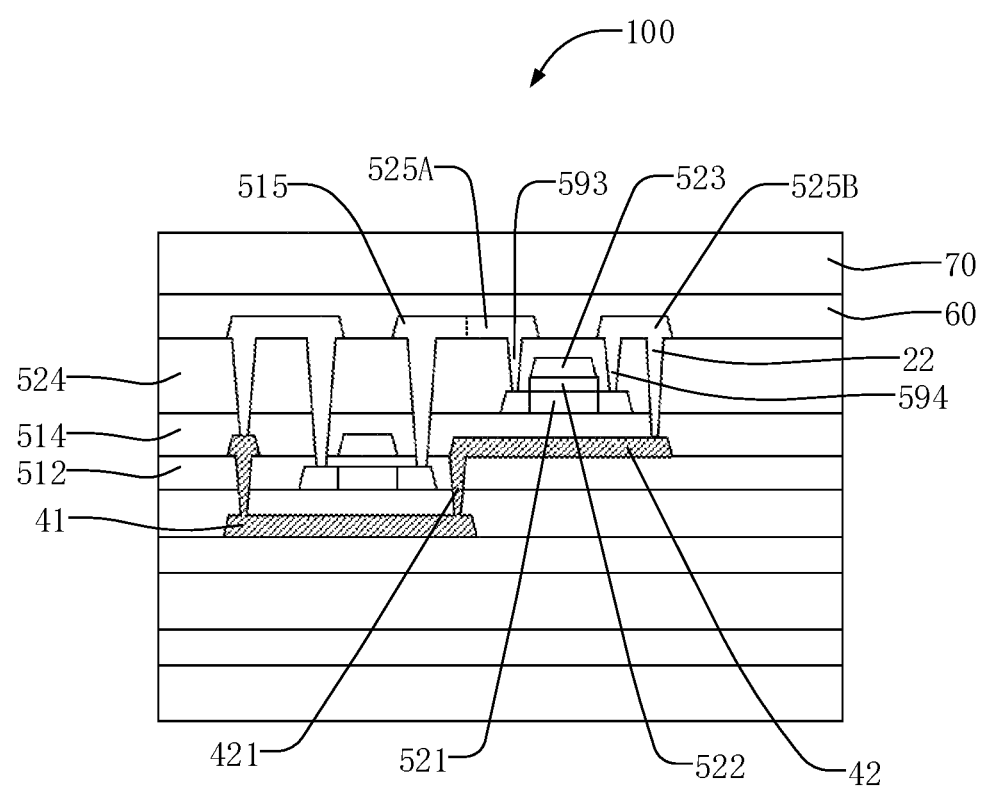
FIG. 3 is a schematic structural layer view of array substrate of the first embodiment of the present invention.

With reference to FIG. 3, the second thin film transistor 52 is disposed on the first dielectric layer 514 and comprises a second active layer 521, a second insulation layer 522, a second gate electrode 523, a second dielectric layer 524, and a second source and drain electrode 525.

The second active layer 521 is disposed on a surface of the first dielectric layer 514 away from the second light shielding layer 42 and is manufactured by metal oxide material. The second insulation layer 522 is disposed on a surface of the second active layer 521 away from the first dielectric layer 514 and corresponds to a channel region of the second active layer 521. The second gate electrode 523 is disposed on a surface of the second insulation layer 522 away from the second active layer 521. The second dielectric layer 524 is disposed on the first dielectric layer 514 and covers exposed surfaces of the second active layer 521, the second insulation layer 522 and the second gate electrode 523. Top portions of the second source and drain electrode 525 and the first source and drain electrode 515 are in the sam layer and are disposed on a surface of the second dielectric layer 524 away from the first dielectric layer 514.

With reference to FIG. 2, the first source and drain electrode 515 comprises a first source electrode 515B and a first drain electrode 515A. The first drain electrode 515A is located at an end of the first thin film transistor 51 away from the second thin film transistor 52, and a first protrusion portion 591 extends out from a bottom surface of the first drain electrode 515A. The first protrusion portion 591 sequentially extends through the second dielectric layer 524, the first dielectric layer 514, and the first insulation layer 512 to be electrically connected to the first active layer 511. The first source electrode 515B is located at an end of the first thin film transistor 51 near the second thin film transistor 52, and a second protrusion portion 592 extends out from a bottom surface of the first source electrode 515B. The second protrusion portion 592 sequentially extends through the second dielectric layer 524, the first dielectric layer 514, and the first insulation layer 512 to be electrically connected to the first active layer 511.

With reference to FIG. 3, the second source and drain electrode 525 comprises second source electrode 525B and a second drain electrode 525A. The second drain electrode 525A is located at an end of the second thin film transistor 52 near the first thin film transistor 51, and an end of second drain electrode 525A near the first thin film transistor 51 is electrically connected to an end of the first source electrode 515B near the second thin film transistor 52. A third protrusion portion 593 extends out from a bottom surface of the second drain electrode 525A, the third protrusion portion 593 extends through a portion of the second dielectric layer 524 to be electrically connected to the second active layer 521. The second source electrode 525B is located at an end of the second thin film transistor 52 away from the first thin film transistor 51 and a fourth protrusion portion 594 extends out from a bottom surface of the second source electrode 525B. The fourth protrusion portion 594 extends through the second dielectric layer 524 to be electrically connected to the second active layer 521.

With reference to FIG. 2, the first shielding layer 21 is located on a side of the first thin film transistor 51 away from the second thin film transistor 52 and has an end electrically connected to the first drain electrode 515A of the first thin film transistor 51 and another end electrically connected to the first light shielding layer 41. The first shielding layer 21 comprises a first connection portion 211 and a second connection portion 212.

A top end of the first connection portion 211 is disposed between the first dielectric layer 514 and the first insulation layer 512 and is located on a side of the first protrusion portion 591 away from the first gate electrode 513. A bottom end of the first connection portion 211 sequentially extends through the first insulation layer 512 and the buffer layer 30 to be electrically connected to the first light shielding layer 41.

Therefore, the second connection portion 212 is also located on a side of the first protrusion portion 591 away from the first gate electrode 513, extends out from a bottom surface of the first drain electrode 515A, and sequentially extends through the second dielectric layer 524 and the first dielectric layer 514 to be electrically connected to the first connection portion 211.

The first shielding layer 21 is electrically connected to the first light shielding layer 41 and the first drain electrode 515A through the first connection portion 211 and the second connection portion 212 to form a conductor casing on a left side and a bottom portion of the first thin film transistor 51 to prevent moving charges in film layers of the left side and the bottom end of the first thin film transistor 51 from entering the first thin film transistor 51.

With reference to FIG. 3, the second shielding layer 22 is located on a side of the second thin film transistor 52 away from the first thin film transistor 51. The second shielding layer 22 extends out from a bottom surface of the second source electrode 525B and sequentially extends through the second dielectric layer 524 and the first dielectric layer 514 to be electrically connected to the second light shielding layer 42.

The second shielding layer 22 is electrically connected to the second light shielding layer 42 and the second drain electrode 525A to form a conductor casing on a right side and a bottom portion of the second thin film transistor 52 to prevent moving charges in film layers of the right side and the bottom end of the second thin film transistor 52 from entering the second thin film transistor 52.

With reference to FIG. 3, the second light shielding layer 42 comprises a third connection portion 421, the third connection portion 421 extends out from a bottom surface of the second light shielding layer 42 and sequentially extends through the first insulation layer 512 and the buffer layer 30 to be electrically connected to the first light shielding layer 41. The first light shielding layer 41 is electrically connected to the second light shielding layer 42 through the third connection portion 421 to electrically connect the conductor casing of the first thin film transistor 51 to the conductor casing of the second thin film transistor 52 to form a dual U-shaped conductor structure.

The dual U-shaped conductor structure encompasses a conductive structure in the first thin film transistor 51 and a conductive structure in the second thin film transistor 52 inside, and isolates moving charges in organic film layers and inorganic film layers of left and right sides and bottom ends of the first thin film transistor 51 and the second thin film transistor 52 outside the first light shielding layer 41, the second light shielding layer 42, the first shielding layer 21 and the second shielding layer 22 to prevent electrostatic effect, which simultaneously keeps excellent electrical properties of the device and mitigates and fixes the issue of afterimages to increase stability of the array substrate 100.

With reference to FIG. 2, the array substrate 100 further comprises a passivation layer 60 and a planarization layer 70. The passivation layer 60 is disposed on the second dielectric layer 524 and covers the first source and drain electrode 515 and the second source and drain electrode 525. The planarization layer 70 is disposed on a surface of the passivation layer 60 away from the first source and drain electrode 515 and the second source and drain electrode 525.

With reference to FIG. 1, the pixel electrode 200 is disposed on the array substrate 100, and extends through the planarization layer 70 and the passivation layer 60 to be electrically connected to first drain electrode 515A of the first thin film transistor 51. The pixel definition layer 300 is disposed on the planarization layer 70 of the array substrate 100 and covers the pixel electrode 200. The pixel definition layer 300 has a via hole, the via hole extends through the pixel definition layer 300 and corresponds to the pixel electrode 200. The support column 400 is disposed on a surface of the pixel definition layer 300 away from the pixel electrode 200. The organic light emitting layer 500 is disposed on the support column 400 and is filled in the via hole. The organic light emitting layer 500 has a cathode 501, and the cathode 501 is located on a surface of the organic light emitting layer 500 away from the support column 400. The thin film encapsulation layer 600, the touch layer 700, the polarizer 800, and the cover plate 900 are stacked on the cathode 501 of the organic light emitting layer 500.

The embodiment of the present invention further provides a method for manufacturing an array substrate 100 configured to manufacture an array substrate 100 in the display panel and comprising manufacturing steps as follows:

A step S110) comprises providing a base layer 10. The base layer 10 comprises a first flexible layer 11, a second flexible layer 13, a first barrier layer 12, and a second barrier layer 14 sequentially stacked on one another.

A step S120) comprises manufacturing a first light shielding layer 41:
a layer of metal material is deposited on a surface of the second barrier layer 14 away from the second flexible layer 13, the layer of metal material is patterned to form the first light shielding layer 41.

A step S130) manufacturing a buffer layer 30:
A layer of inorganic material is deposited on the second barrier layer 14 and covers the first light shielding layer 41 to form the buffer layer 30.

A step S140) manufacturing a semi-product of the first thin film transistor 51 and a second light shielding layer 42:
A first active layer 511 is manufactured on a surface of the buffer layer 30 away from the first light shielding layer 41 by a low temperature polysilicon semiconductor process.

A layer of inorganic material is deposited on the buffer layer and covers the first active layer 511 to form the first insulation layer 512.

The first insulation layer 512 and the buffer layer 30 are patterned, a first via hole and a second via hole are formed in two ends of the first light shielding layer 41 respectively. The first via hole and the second via hole extends through the first insulation layer 512 and the buffer layer 30 to a surface of the first light shielding layer 41.

A layer of metal material is formed on a surface of the first insulation layer 512 away from the first active layer 511 such that the metal material is filled in the first via hole and the second via hole. The metal material layer is patterned to form a first connection portion 211 in the first gate electrode 513, the second light shielding layer 42, and the first shielding layer 21. Metal material in the first via hole forms the first connection portion 211, metal material in the second via hole forms third connection portion 421 of the second metal layer. The first gate electrode 513 is located between the second light shielding layer 42 and the first connection portion 211.

A layer of inorganic material is deposited on the first insulation layer 512, the inorganic material covers the first gate electrode 513, the second light shielding portion, and the first connection portion 211, and the inorganic material layer is a first dielectric layer 514.

The first active layer 511, the first insulation layer 512, the first gate electrode 513 and the first dielectric layer 514 combine to form a semi-product of the first thin film transistor 51.

A step S150) comprises manufacturing a second thin film transistor 52 and a first source and drain electrode 515 in the first thin film transistor 51:

A second active layer 521 is manufactured on a surface of the first dielectric layer 514 away from the first gate electrode 513 by a metal oxide semiconductor process.

A layer of inorganic material is deposited on a surface of the second active layer 521 away from the first dielectric layer 514 to form a second insulation layer 522.

A layer of metal material is formed on a surface of the second insulation layer 522 away from the second active layer 521 to form a second gate electrode 523.

A layer of inorganic material is deposited on the first dielectric layer 514, and the inorganic material covers the second active layer 521 exposed surfaces of the second insulation layer 522, and the second gate electrode 523. The inorganic material layer is a second dielectric layer 524.

The second dielectric layer 524, the first dielectric layer 514 and the first insulation layer 512 are patterned to form a third via hole, a fourth via hole, a fifth via hole, a sixth via hole, a seventh via hole, and an eighth via hole. The third via hole and the fourth via hole are located respectively on two sides of the first gate electrode 513 and sequentially extend through the second dielectric layer 524, the first dielectric layer 514, and the first insulation layer 512 to a surface of the first active layer 511. The fifth via hole and the sixth via hole are located respectively on two sides of the second gate electrode 523 and extend through the second dielectric layer 524 to a surface of the second active layer 521. The seventh via hole is located on a side of the first thin film transistor 51 away from the second thin film transistor 52 and sequentially extends through the second dielectric layer 524 and first dielectric layer 514 to a top surface of the first connection portion 211. The eighth thin film transistor is located on a side of the second thin film transistor 52 away from the first thin film transistor 51 and sequentially extends through the second dielectric layer 524 and first dielectric layer 514 to a top surface of the second light shielding layer 42.

A layer of metal material is formed on the second dielectric layer 524 such that the metal material is filled in the third via hole, the fourth via hole, the fifth via hole, the sixth via hole, the seventh via hole, and the eighth via hole. The metal material is patterned to form a first source and drain electrode 515 and a second source and drain electrode 525.

Metal material in the third via hole forms a first protrusion portion 591 of a first drain electrode 515A in the first source and drain electrode 515. Metal material in the fourth via hole forms a second protrusion portion 592 of a first source electrode 515B in the first source and drain electrode 515. Metal material in the fifth via hole forms a third protrusion portion 593 of a second drain electrode 525A in the second source and drain electrode 525. Metal material in the sixth via hole forms a fourth protrusion portion 594 of a second source electrode 525B in the second source and drain electrode 525. Metal material in the seventh via hole forms a second connection portion 212 in the first shielding layer 21 and is connected to the first drain electrode 515A. Metal material in the eighth via hole forms a second shielding layer 22 and is connected to the second source electrode 525B.

The first source and drain electrode 515 and the first thin film transistor 51 semi-product combine to form a first thin film transistor 51. The second active layer 521, the second insulation layer 522, the second gate electrode 523, the second dielectric layer 524, and the second source and drain electrode 525 combine to form the second thin film transistor 52.

A step S160) comprises manufacturing a passivation layer 60 and a planarization layer 70:

A layer of inorganic material is deposited on the second dielectric layer 524, the inorganic material covers the first source and drain electrode 515 and the second source and drain electrode 525, and the inorganic material layer is a passivation layer 60.

A layer of inorganic material is deposited on a surface of the passivation layer 60 away from the first source and drain electrode 515 and the second source and drain electrode 525 to form the planarization layer 70 to complete manufacturing of the array substrate 100.

An array substrate 100 and a manufacturing method thereof provided by the embodiment of the present invention form a first shielding layer 21 and a second shielding layer 22 connected to a source and drain electrode and a light shielding layer on two sides of a thin film transistor to further form a dual U-shaped conductor structure encompassing a first thin film transistor 51 and a second thin film transistor 52 to perfectly shield moving charges in a film layer under the thin film transistor and film layers on sides of the thin film transistor outside the dual U-shaped conductor structure, which simultaneously keeps excellent electrical properties of the device and mitigates and fixes an issue of afterimages to increase stability of the display panel.

Second Embodiment

Figure 4:
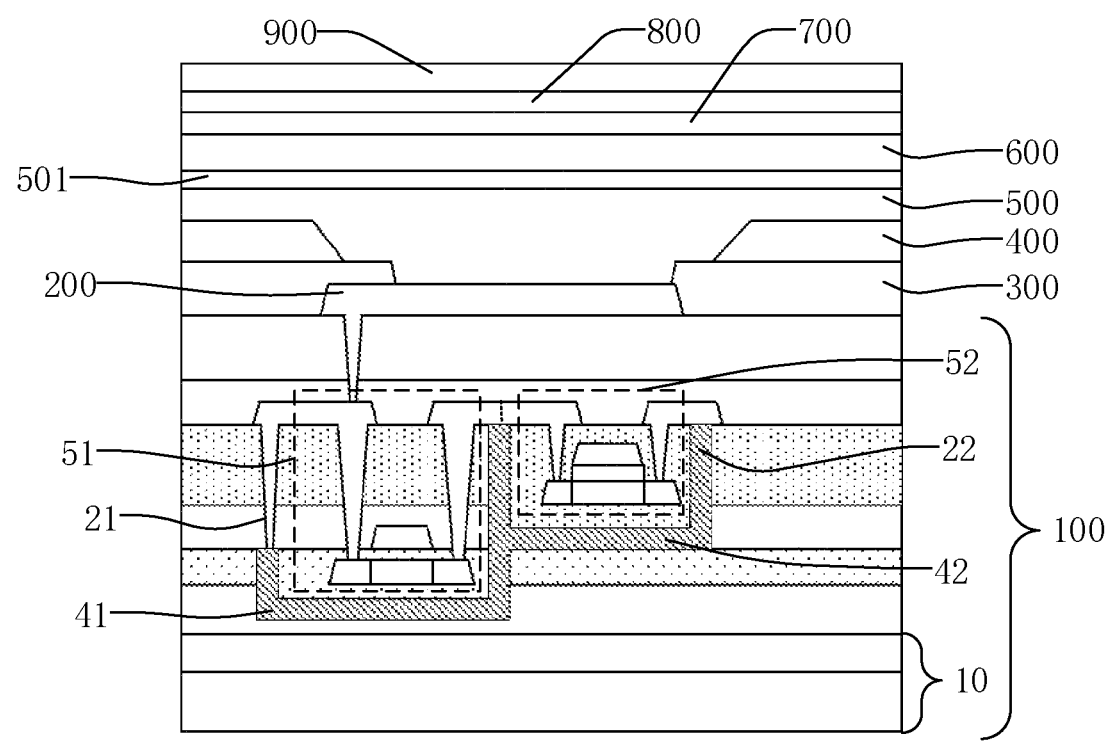
FIG. 4 is a schematic structural layer view of the display panel of a second embodiment of the present invention.

The embodiment of the present invention provides a display panel. With reference to FIG. 4, the display panel comprises an array substrate 100, a pixel electrode 200, a pixel definition layer 300, a support column 400, an organic light emitting layer 500, a thin film encapsulation layer 600, a touch layer 700, a polarizer 800, and a cover plate 900.

The array substrate 100 uses a low temperature polycrystalline oxide (LTPO) type array substrate 100 that is integrated with advantages of low temperature polysilicon and oxide, and has merits of fast response speed and lower power consumption. With reference to FIG. 4, the array substrate 100 comprises a base layer 10, a first light shielding layer 41, a second light shielding layer 42, a first shielding layer 21, a second shielding layer 22, a buffer layer 30, and a first thin film transistor 51 and a second thin film transistor 52 disposed on the base layer 10.

Figure 5:
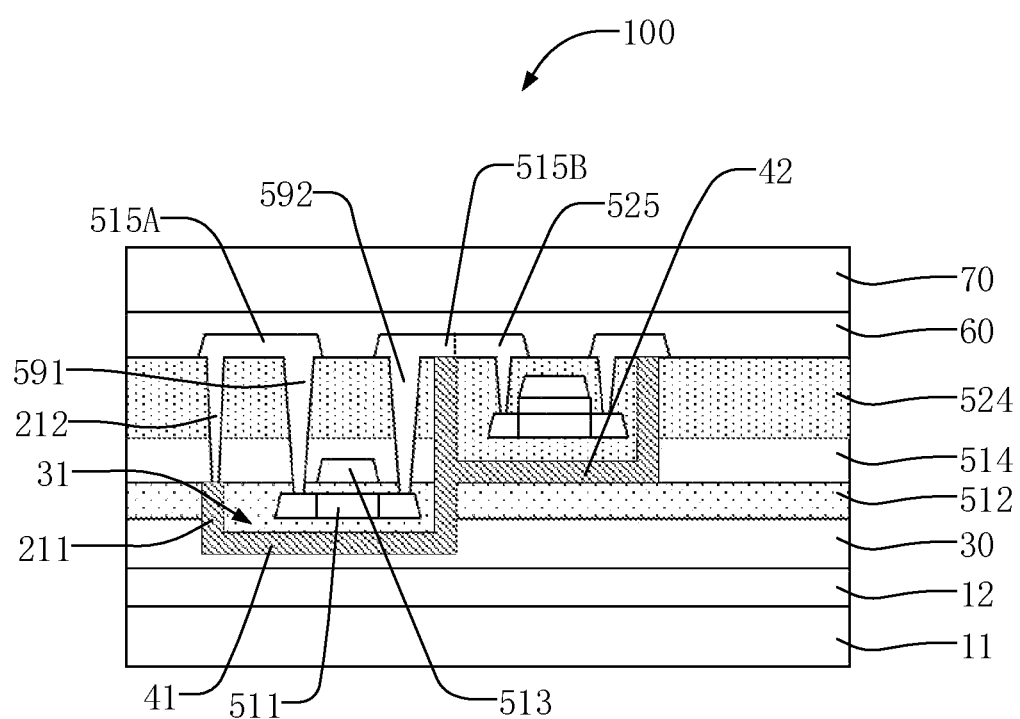
FIG. 5 is a schematic structural layer view of an array substrate of the second embodiment of the present invention.

With reference to FIG. 5, the base layer 10 comprises a first flexible layer 11 and a first barrier layer 12. The first flexible layer 11 and the first barrier layer 12 are stacked together. Material of the first flexible layer 11 is polyimide. Because of characteristic of the polyimide material, the array substrate 100 is bendable to achieve a curve display and a bending display. Material of the first barrier layer 12 is organic material or inorganic material and is configured to block water oxygen and prevent a device in the array substrate 100 from corrosive degeneration, guarantee stability of the device, and prolong a lifespan of the array substrate 100.

The buffer layer 30 is disposed on a surface of the first barrier layer 12 away from the first flexible layer 11, is inorganic insulative material, and is configured to insulatively protect the first light shielding layer 41 and simultaneously buffer and protect the first thin film transistor 51 and the second thin film transistor 52. The buffer layer 30 comprises a first recess 31, and a recess opening of the first recess 31 faces the first active layer 511 of the first thin film transistor 51.

The first light shielding layer 41 is disposed on a recess bottom of the first recess 31 and corresponds to the first active layer 511 in the first thin film transistor 51. The first light shielding layer 41 is metal material, and is configured to shield the first thin film transistor 51 to prevent light from influencing operation of the first active layer 511.

With reference to FIG. 5, the first thin film transistor 51 is disposed on the buffer layer 30 and has a first active layer 511, a first insulation layer 512, a first gate electrode 513, a first dielectric layer 514, and a first source and drain electrode 515.

The first insulation layer 512 is disposed on a surface of the buffer layer 30 away from the first barrier layer 12 and is filled in a remaining space of the first recess 31. The first active layer 511 is disposed in the first insulation layer 512, the first insulation layer 512 encircles the first active layer 511, and the first active layer 511 is manufactured by low temperature polysilicon material. The first gate electrode 513 is disposed on a surface of the first insulation layer 512 away from the buffer layer 30 and corresponds to a channel region of the first active layer 511. The first dielectric layer 514 is disposed on the first insulation layer 512 and covers the first gate electrode 513. The first source and drain electrode 515 is disposed above the first dielectric layer 514.

Figure 6:
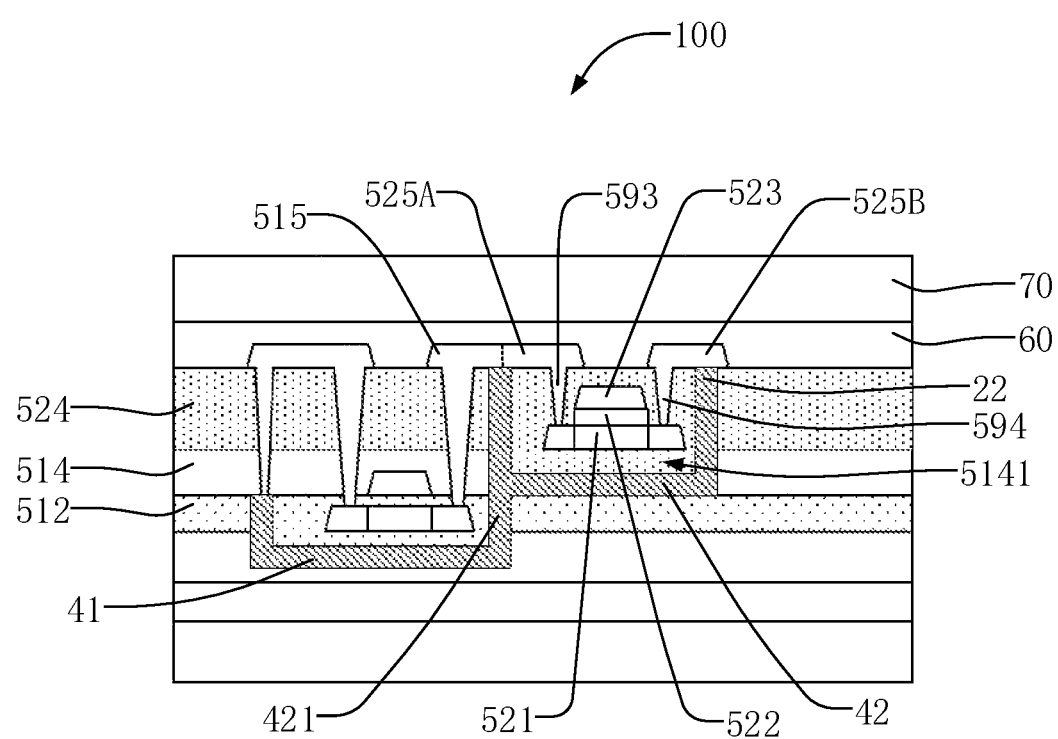
FIG. 6 is a schematic structural layer view of the array substrate of the second embodiment of the present invention.

With reference to FIG. 6, the first dielectric layer 514 comprises a second recess 5141, a recess opening of the second recess 5141 faces the second active layer 521 in the second thin film transistor 52. The second light shielding layer 42 is disposed on a recess bottom of the second recess 5141 and corresponds to the second active layer 521 of the second thin film transistor 52. In the present embodiment, the second recess 5141 extends through the first dielectric layer 514, namely, the recess bottom of the second recess 5141 is the top surface of the first insulation layer 512. The second light shielding layer 42 is disposed on the first insulation layer 512 in the second recess 5141, and the second light shielding layer 42 and the first gate electrode 513 are disposed in the same layer. The second light shielding layer 42 also uses metal material and is configured to shield the second thin film transistor 52 to prevent light from influencing operation of the second active layer 521.

With reference to FIG. 6, the second thin film transistor 52 is disposed on the first dielectric layer 514 and comprises a second active layer 521, a second insulation layer 522, a second gate electrode 523, a second dielectric layer 524, and a second source and drain electrode 525.

The second dielectric layer 524 is disposed on a surface of the first dielectric layer 514 away from the first gate electrode 513 layer and is filled in a remaining space of the second recess 5141. The second active layer 521, the second insulation layer 522, and the second gate electrode 523 are laminated and disposed in the second dielectric layer 524. The second insulation layer 522 is disposed on a surface of the second active layer 521 away from the second light shielding layer 42 and corresponds to a channel region of the second active layer 521. The second gate electrode 523 is disposed on a surface of the second insulation layer 522 away from the second active layer 521. The second active layer 521 is manufactured by metal oxide material. Top portions of the second source and drain electrode 525 and the first source and drain electrode 515 are in the same layer and are disposed on a surface of the second dielectric layer 524 away from the first dielectric layer 514.

With reference to FIG. 5, the first source and drain electrode 515 comprises a first source electrode 515B and a first drain electrode 515A. The first drain electrode 515A is located at an end of the first thin film transistor 51 away from the second thin film transistor 52, and a first protrusion portion 591 extends out from a bottom surface of the first drain electrode 515A. The first protrusion portion 591 sequentially extends through the second dielectric layer 524, the first dielectric layer 514, and a portion of the first insulation layer 512 are electrically connected to the first active layer 511. The first source electrode 515B is located at an end of the first thin film transistor 51 near the second thin film transistor 52, and a second protrusion portion 592 extends out from the bottom surface of the first source electrode 515B. The second protrusion portion 592 sequentially extends through the second dielectric layer 524, the first dielectric layer 514, and a portion of the first insulation layer 512 to be electrically connected to the first active layer 511.

With reference to FIG. 6, the second source and drain electrode 525 comprises a second source electrode 525B and a second drain electrode 525A. The second drain electrode 525A is located at an end of the second thin film transistor 52 near the first thin film transistor 51, and an end of the second drain electrode 525A near the first thin film transistor 51 is electrically connected to an end of the first source electrode 515B near the second thin film transistor 52. A third protrusion portion 593 extends out from a bottom surface of the second drain electrode 525A, the third protrusion portion 593 extends through a portion of the second dielectric layer 524 to be electrically connected to the second active layer 521. The second source electrode 525B is located at an end of the second thin film transistor 52 away from the first thin film transistor 51 and a fourth protrusion portion 594 extends out from a bottom surface of the second source electrode 525B. The fourth protrusion portion 594 extends through a portion of the second dielectric layer 524 to be electrically connected to the second active layer 521.

With reference to FIG. 5, the first shielding layer 21 is located on a side of the first thin film transistor 51 away from the second thin film transistor 52 and has an end electrically connected to the first drain electrode 515A of the first thin film transistor 51 and another end electrically connected to the first light shielding layer 41. The first shielding layer 21 comprises a first connection portion 211 and a second connection portion 212.

A top surface of the first connection portion 211 is flush with a top surface of the first insulation layer 512, and a bottom end of the first connection portion 211 sequentially extends through the first insulation layer 512 and a portion of the buffer layer 30 to be electrically connected to the first light shielding layer 41.

Therefore, the second connection portion 212 is located on a side of the first protrusion portion 591 away from the first gate electrode 513, extends out from a bottom surface of the first drain electrode 515A, and sequentially extends through the second dielectric layer 524 and the first dielectric layer 514 to be electrically connected to the first connection portion 211.

The first shielding layer 21 is electrically connected to the first light shielding layer 41 and the first drain electrode 515A through the first connection portion 211 and the second connection portion 212 to form a conductor casing on a left side and a bottom portion of the first thin film transistor 51 to prevent moving charges in film layers of the left side and the bottom end of the first thin film transistor 51 from entering the first thin film transistor 51.

With reference to FIG. 6, the second shielding layer 22 is located on a side of the second thin film transistor 52 away from the first thin film transistor 51. The second shielding layer 22 extends out from a bottom surface of the second source electrode 525B and sequentially extends through the second dielectric layer 524 and the first dielectric layer 514 to be electrically connected to the second light shielding layer 42.

The second shielding layer 22 is electrically connected to the second light shielding layer 42 and the second drain electrode 525A to form a conductor casing on a right side and a bottom portion of the second thin film transistor 52 to prevent moving charges in film layers of the right side and the bottom end of the second thin film transistor 52 from entering the second thin film transistor 52.

The second light shielding layer 42 comprises a third connection portion 421, the third connection portion 421 extends out from a bottom surface of the second light shielding layer 42 and sequentially extends through the first insulation layer 512 and a portion of the buffer layer 30 to be electrically connected to the first light shielding layer 41.

The first shielding layer 21, the second shielding layer 22, the third shielding layer 23, the first light shielding layer 41, and the second light shielding layer 42 form a dual U-shaped conductor structure to encompass a conductive structure of the first thin film transistor 51 and a conductive structure of the second thin film transistor 52 in a U-shaped structure to isolate moving charges in organic film layers, inorganic film layers of the left and right sides of the first thin film transistor 51, the two sides and the bottom end of the second thin film transistor 52 outside the first light shielding layer 41, the second light shielding layer 42, the first shielding layer 21, the second shielding layer 22, and the third shielding layer 23 to prevent electrostatic effect, which simultaneously keeps excellent electrical properties of the device and mitigates and fixes the issue of afterimages to increase stability of the array substrate 100.

With reference to FIG. 5, the array substrate 100 further comprises a passivation layer 60 and a planarization layer 70. The passivation layer 60 is disposed on the second dielectric layer 524 and covers the first source and drain electrode 515 and the second source and drain electrode 525. The planarization layer 70 is disposed on a surface of the passivation layer 60 away from the first source and drain electrode 515 and the second source and drain electrode 525.

With reference to FIG. 4, the pixel electrode 200 is disposed on the array substrate 100, and extends through the planarization layer 70 and the passivation layer 60 to be electrically connected to first drain electrode 515A of the first thin film transistor 51. The pixel definition layer 300 is disposed on the planarization layer 70 of the array substrate 100 and covers the pixel electrode 200. The pixel definition layer 300 has a via hole, the via hole extends through the pixel definition layer 300 and corresponds to the pixel electrode 200. The support column 400 is disposed on a surface of the pixel definition layer 300 away from the pixel electrode 200. The organic light emitting layer 500 is disposed on the support column 400 and is filled in the via hole. The organic light emitting layer 500 has a cathode 501, and the cathode 501 is located on a surface of the organic light emitting layer 500 away from the support column 400. The thin film encapsulation layer 600, the touch layer 700, the polarizer 800, and the cover plate 900 are stacked on the cathode 501 of the organic light emitting layer 500.

The embodiment of the present invention further provides a method for manufacturing an array substrate 100 configured to manufacture an array substrate 100 in the display panel and comprising manufacturing steps as follows:

A step S210) comprises providing a base layer 10, wherein the base layer 10 comprises a first flexible layer 11 and a first barrier layer 12 stacked together.

A step S220) comprises manufacturing a buffer layer 30:

A layer of inorganic material is deposited on the first barrier layer 12 to form the buffer layer 30. The buffer layer 30 is patterned to form a first recess 31.

A step S230) comprises manufacturing a first light shielding layer 41:

A layer of metal material is deposited on a bottom surface of the first recess 31 to form the first light shielding layer 41.

A step S240) comprises manufacturing a semi-product of the first thin film transistor 51 and a second light shielding layer 42:

A layer of inorganic material is disposed on the buffer layer 30 and covers the first active layer 511, the inorganic material is filled in the first recess 31 to form the semi-product of a first insulation layer 512.

A first active layer 511 is formed on a surface of the semi-product of the first insulation layer 512 away from the first light shielding layer 41 by a low temperature polysilicon semiconductor process.

A layer of inorganic material is subsequentially deposited on the semi-product of the first insulation layer 512, the layer inorganic material covers the first active layer 511 an combines the semi-product of the first insulation layer 512 to form the first insulation layer 512.

The first insulation layer 512 and the buffer layer 30 are patterned, a first via hole and a second via hole are formed in two ends of the first light shielding layer 41 respectively. The first via hole and the second via hole extends through the first insulation layer 512 and the buffer layer 30 to a surface of the first light shielding layer 41.

A layer of metal material is formed on a surface of the first insulation layer 512 away from the first active layer 511 such that the metal material is filled in the first via hole and the second via hole. The metal material layer is patterned to form a first connection portion 211 in the first gate electrode 513, the second light shielding layer 42, and the first shielding layer 21. Metal material in the first via hole forms the first connection portion 211, metal material in the second via hole forms third connection portion 421 of the second metal layer. The first gate electrode 513 is located between the second light shielding layer 42 and the first connection portion 211.

A layer of inorganic material is deposited on the first insulation layer 512, the inorganic material covers the first gate electrode 513, the second light shielding portion, and the first connection portion 211, and the inorganic material layer is a first dielectric layer 514. The first dielectric layer 514 is patterned to form a second recess 5141 corresponding to the second light shielding layer 42 and having the same width.

The first active layer 511, the first insulation layer 512, the first gate electrode 513 and the first dielectric layer 514 combine to form a semi-product of the first thin film transistor 51.

A step S250) comprises manufacturing a second thin film transistor 52 and a first source and drain electrode 515 in the first thin film transistor 51:

A layer of inorganic material is deposited on a surface of the first dielectric layer 514 away from the first gate electrode 513, and the inorganic material is filled in the second recess 5141 to form a semi-product of a second dielectric layer 524.

A second active layer 521 is manufactured on a surface of the semi-product of the second dielectric layer 524 away from the second light shielding layer 42 by a metal oxide semiconductor process.

A layer of inorganic material is deposited on a surface of the second active layer 521 away from the first dielectric layer 514 to form a second insulation layer 522.

A layer of metal material is formed on a surface of the second insulation layer 522 away from the second active layer 521 to form a second gate electrode 523.

A layer of inorganic material is deposited on the first dielectric layer 514, the inorganic material covers the second active layer 521 exposed surfaces of the second insulation layer 522, and the second gate electrode 523, and combines the semi-product of the second dielectric layer 524 to form the second dielectric layer 524.

The second dielectric layer 524, the first dielectric layer 514 and the first insulation layer 512 are patterned to form a third via hole, a fourth via hole, a fifth via hole, a sixth via hole, a seventh via hole, and an eighth via hole. The third via hole and the fourth via hole are located respectively on two sides of the first gate electrode 513 and sequentially extend through the second dielectric layer 524, the first dielectric layer 514, and the first insulation layer 512 to a surface of the first active layer 511. The fifth via hole and the sixth via hole are located respectively on two sides of the second gate electrode 523 and extend through the second dielectric layer 524 to a surface of the second active layer 521. The seventh via hole is located on a side of the first thin film transistor 51 away from the second thin film transistor 52 and sequentially extends through the second dielectric layer 524 and first dielectric layer 514 to a top surface of the first connection portion 211. The eighth thin film transistor is located on a side of the second thin film transistor 52 away from the first thin film transistor 51 and sequentially extends through the second dielectric layer 524 and first dielectric layer 514 to a top surface of the second light shielding layer 42.

A layer of metal material is formed on the second dielectric layer 524 such that the metal material is filled in the third via hole, the fourth via hole, the fifth via hole, the sixth via hole, the seventh via hole, and the eighth via hole. The metal material is patterned to form a first source and drain electrode 515 and a second source and drain electrode 525.

Metal material in the third via hole forms a first protrusion portion 591 of a first drain electrode 515A in the first source and drain electrode 515. Metal material in the fourth via hole forms a second protrusion portion 592 of a first source electrode 515B in the first source and drain electrode 515. Metal material in the fifth via hole forms a third protrusion portion 593 of a second drain electrode 525A in the second source and drain electrode 525. Metal material in the sixth via hole forms a fourth protrusion portion 594 of a second source electrode 525B in the second source and drain electrode 525. Metal material in the seventh via hole forms a second connection portion 212 in the first shielding layer 21 and is connected to the first drain electrode 515A. Metal material in the eighth via hole forms a second shielding layer 22 and is connected to the second source electrode 525B.

The first source and drain electrode 515 and the first thin film transistor 51 semi-product combine to form a first thin film transistor 51. The second active layer 521, the second insulation layer 522, the second gate electrode 523, the second dielectric layer 524, and the second source and drain electrode 525 combine to form the second thin film transistor 52.

A step S260) comprises manufacturing a passivation layer 60 and a planarization layer 70:

A layer of inorganic material is deposited on the second dielectric layer 524, the inorganic material covers the first source and drain electrode 515 and the second source and drain electrode 525, and the inorganic material layer is a passivation layer 60.

A layer of inorganic material is deposited on a surface of the passivation layer 60 away from the first source and drain electrode 515 and the second source and drain electrode 525 to form the planarization layer 70 to complete manufacturing of the array substrate 100.

The array substrate 100 and the manufacturing method thereof provided by the embodiment of the present invention form a first shielding layer 21 on two sides of the thin film transistor connected to a source and drain electrode and the light shielding layer, the second shielding layer 22, and the third shielding layer 23 to further encompass dual U-shaped conductor structures of the first thin film transistor 51 and the second thin film transistor 52 respectively to perfectly shield moving charges in the film layer under the thin film transistor and the film layers on two sides of the thin film transistor outside the dual U-shaped conductor structure, which simultaneously keeps excellent electrical properties of the device and mitigates and fixes an issue of afterimages to increase stability of the display panel.

Although the present invention is described with reference to specific implementations in this specification, it should be understood that these embodiments are merely examples of the principles and applications of the present invention. Therefore, it should be understood that many exemplary embodiments can be modified, and other arrangements can be designed, as long as they do not deviate from the spirit and range of the present invention defined by the appended claims. It should be understood that different dependent claims and the features in the specification can be combined in ways different from those described in the original claims. It is also understood that the features described in combination with a separate embodiment can be used in other the embodiment.

What is claimed is:

1. An array substrate, comprising:
   a first thin film transistor and a second thin film transistor disposed on a base layer;
   a first light shielding layer disposed under the first thin film transistor and disposed opposite to a first active layer in the first thin film transistor;
   a second light shielding layer disposed under the second thin film transistor and disposed opposite to a second active layer of the second thin film transistor, wherein a bottom surface of the second light shielding layer is connected to the first light shielding layer;
   a first shielding layer disposed on a side of the first thin film transistor away from the second thin film transistor, wherein an end of the first shielding layer is electrically connected to a first source and drain electrode of the first thin film transistor, and another end of the first shielding layer is electrically connected to the first light shielding layer; and a second shielding layer disposed on a side of the second thin film transistor away from the first thin film transistor, wherein an end of the second shielding layer is electrically connected to a second source and drain electrode of the second thin film transistor, and another end of the second shielding layer is electrically connected to the second light shielding layer;

wherein the first active layer and the second active layer are located between the first shielding layer and the second shielding layer;

wherein a buffer layer is disposed between the base layer and the first thin film transistor, or disposed between the base layer and the second thin film transistor;

wherein the first thin film transistor comprises: a first insulation layer disposed on the buffer layer, wherein the first active layer is disposed in the first insulation layer; a first gate electrode disposed on a surface of the first insulation layer away from the buffer layer and disposed opposite to the first active layer; a first dielectric layer disposed on the first insulation layer and covering the first gate electrode; and a first source and drain electrode disposed on a surface of the first dielectric layer away from the first gate electrode;

wherein the first source and drain electrode comprises: a first drain electrode, wherein a bottom surface of first drain electrode comprises a first protrusion portion, the first protrusion portion extends through the first dielectric layer and the first insulation layer and is electrically connected to the first active layer; and a first source electrode, wherein a bottom surface of first source electrode comprises a second protrusion portion, the second protrusion portion extends through the first dielectric layer and the first insulation layer and is electrically connected to the first active layer;

wherein the first active layer is entirely encircled in the first insulation layer, the buffer layer comprises a first recess, and a recess opening of the first recess faces the first active layer, the first light shielding layer is disposed on a bottom surface of the first recess, and the first insulation layer is disposed on the buffer layer and is filled in the first recess.

2. The array substrate according to claim 1, wherein the second thin film transistor comprises:

a second dielectric layer disposed between the first dielectric layer and the first source and drain electrode;

the second active layer disposed between the first dielectric layer and the second dielectric layer, or disposed in the second dielectric layer;

a second insulation layer disposed on a surface of the second active layer away from the first dielectric layer;

a second gate electrode disposed on a surface of the second insulation layer away from the second active layer; and the second source and drain electrode disposed on a surface of the second dielectric layer away from the second gate electrode; and the second source and drain electrode comprises:

a second drain electrode, wherein a bottom surface of second drain electrode comprises a third protrusion portion, the third protrusion portion extends through the second dielectric layer and is electrically connected to the second active layer, and an end of the second drain electrode near the first thin film transistor is electrically connected to the first source electrode; and a second source electrode, wherein a bottom surface of second source electrode comprises a fourth protrusion portion, the fourth protrusion portion extends through the second dielectric layer and is electrically connected to the second active layer.

3. The array substrate according to claim 2, wherein when the second active layer is disposed in the second dielectric layer, the first dielectric layer comprises a second recess, and a recess opening of the second recess faces the second active layer;

the second light shielding layer is disposed on a bottom surface of the second recess; and the second dielectric layer is disposed on the first dielectric layer and is filled in the second recess.

4. The array substrate according to claim 2, further comprising:

a third shielding layer located between the second protrusion portion and the third protrusion portion;

wherein an end of the third shielding layer is electrically connected to the second light shielding layer, and another end of the third shielding layer extends through the second dielectric layer and is electrically connected to the first source electrode and the second drain electrode.

* * * * *